(12) United States Patent
Chien (10) Patent No.: US 8,896,384 B2
(45) Date of Patent: *Nov. 25, 2014

(54) PHASE LOCKED LOOP INCLUDING A FREQUENCY CHANGE MODULE

(75) Inventor: Hung-Ming Chien, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 739 days.

This patent is subject to a terminal disclaimer.

(21) Appl. No.: 13/019,046

(22) Filed: Feb. 1, 2011

(65) Prior Publication Data

US 2011/0121873 A1 May 26, 2011

Related U.S. Application Data

(63) Continuation of application No. 12/318,906, filed on Jan. 12, 2009, now Pat. No. 7,884,675, which is a continuation of application No. 11/318,593, filed on Dec. 28, 2005, now Pat. No. 7,482,881.

(60) Provisional application No. 60/731,288, filed on Oct. 31, 2005.

(51) Int. Cl.
| | |
|---|---|
| *H03L 7/00* | (2006.01) |
| *H03L 7/197* | (2006.01) |
| *H03L 7/23* | (2006.01) |
| *H03L 7/18* | (2006.01) |
| *H03L 7/089* | (2006.01) |

(52) U.S. Cl.
CPC ............... *H03L 7/1976* (2013.01); *H03L 7/18* (2013.01); *H03L 7/0891* (2013.01); *H03L 7/23* (2013.01)
USPC .................. 331/16; 331/1 A; 331/34; 331/46; 331/18; 327/156; 327/159; 455/260

(58) Field of Classification Search
CPC ........................................................ H03L 7/18
USPC ........... 331/1 A, 25, 16, 46, 49; 327/156, 159
See application file for complete search history.

(56) References Cited

U.S. PATENT DOCUMENTS

| | | | |
|---|---|---|---|
| 5,021,754 A * | 6/1991 | Shepherd et al. | 332/128 |
| 6,985,708 B2 | 1/2006 | Lin et al. | |
| 7,443,250 B2 | 10/2008 | Seethamraju et al. | |
| 7,482,881 B2 * | 1/2009 | Chien | 331/16 |
| 7,538,622 B2 * | 5/2009 | Feng | 331/16 |
| 7,733,137 B2 * | 6/2010 | Feng | 327/156 |
| 7,884,675 B2 * | 2/2011 | Chien | 331/16 |
| 2003/0231729 A1 | 12/2003 | Chien et al. | |

* cited by examiner

*Primary Examiner* — Arnold Kinkead (74) *Attorney, Agent, or Firm* — Sterne, Kessler, Goldstein & Fox P.L.L.C.

(57) ABSTRACT

A phase locked loop (PLL) includes a detector, a charge pump, a loop filter, a voltage controlled oscillator (VCO), a divider, and a frequency change module. The detector provides a phase difference based on a reference signal and a feedback signal. The charge pump provides a charge based on the phase difference. The loop filter provides a voltage based on the charge. The VCO provides an output signal based on the voltage received from the loop filter. The divider divides a frequency of the output signal by a value to provide the feedback signal. The frequency change module processes an input signal having a first frequency to provide a processed signal having a second frequency that is different from the first frequency. The frequency change module selects the input signal or the processed signal to provide as the reference signal to the detector. Changing the frequency of the reference signal can change a frequency of a spur.

20 Claims, 7 Drawing Sheets

PHASE LOCKED LOOP INCLUDING A FREQUENCY CHANGE MODULE

CROSS REFERENCE TO RELATED APPLICATIONS

This application is a continuation of U.S. patent application Ser. No. 12/318,906, filed Jan. 12, 2009, (now U.S. Pat No. 7,884,675) which is a continuation of U.S. patent application Ser. No. 11/318,593, filed Dec. 28, 2005, (now U.S. Pat. No. 7,482,881) which claims benefit of U.S. Provisional Application No. 60/731,288, filed Oct. 31, 2005, all of which are incorporated herein by reference in their entirety.

BACKGROUND OF THE INVENTION

1. Field of the Invention

The present invention relates generally to circuitry, and more specifically to circuitry that includes a phase locked loop (PLL).

2. Background

Phase locked loops (PLLs) are used in any of a variety of systems, such as wireless and wire line communication systems, to synchronize signals. In a PLL, a phase detector compares a feedback signal and a reference signal to generate a phase error signal. The phase error signal indicates a phase difference between the feedback signal and the reference signal. A charge pump provides a charge based on the phase error signal. A loop filter provides a voltage based on the charge. A voltage controlled oscillator (VCO) generates a system output signal having a frequency that is based on the voltage provided by the loop filter. A divider divides the frequency of the system output signal by a value to generate the feedback signal. The value utilized by the divider can be an integer or a non-integer.

Utilizing an integer value to generate the feedback signal provides a system output signal having a frequency that is an integer multiple of the frequency of the reference signal. Utilizing a non-integer value enables the PLL to provide a system output signal having a frequency that is a non-integer multiple of the frequency of the reference signal. However, generating the non-integer value gives rise to spurs. For example, the system output signal can have sidebands that negatively impact the performance of the PLL. Such spurs can reduce the signal-to-noise ratio (SNR) of the reference signal and/or degrade the bit error rate (BER) of the PLL.

What is needed, then, is a system and method that addresses one or more of the aforementioned shortcomings of conventional PLLs and feedback techniques.

BRIEF DESCRIPTION OF THE DRAWINGS/FIGURES

The accompanying drawings, which are incorporated herein and form part of the specification, illustrate embodiments of the present invention and, together with the description, further serve to explain the principles of the invention and to enable a person skilled in the pertinent art(s) to make and use the invention.

In the drawings, like reference numbers indicate identical or functionally similar elements. Additionally, the leftmost digit(s) of a reference number identifies the drawing in which the reference number first appears.

DETAILED DESCRIPTION OF THE INVENTION

Although the embodiments of the invention described herein refer specifically, and by way of example, to wireless and wire line communication systems, including fractional-N synthesizers, it will be readily apparent to persons skilled in the relevant art(s) that the invention is equally applicable to other networks and systems. It will also be readily apparent to persons skilled in the relevant art(s) that the invention is applicable to any apparatus or system requiring spur reduction.

Figure 1:
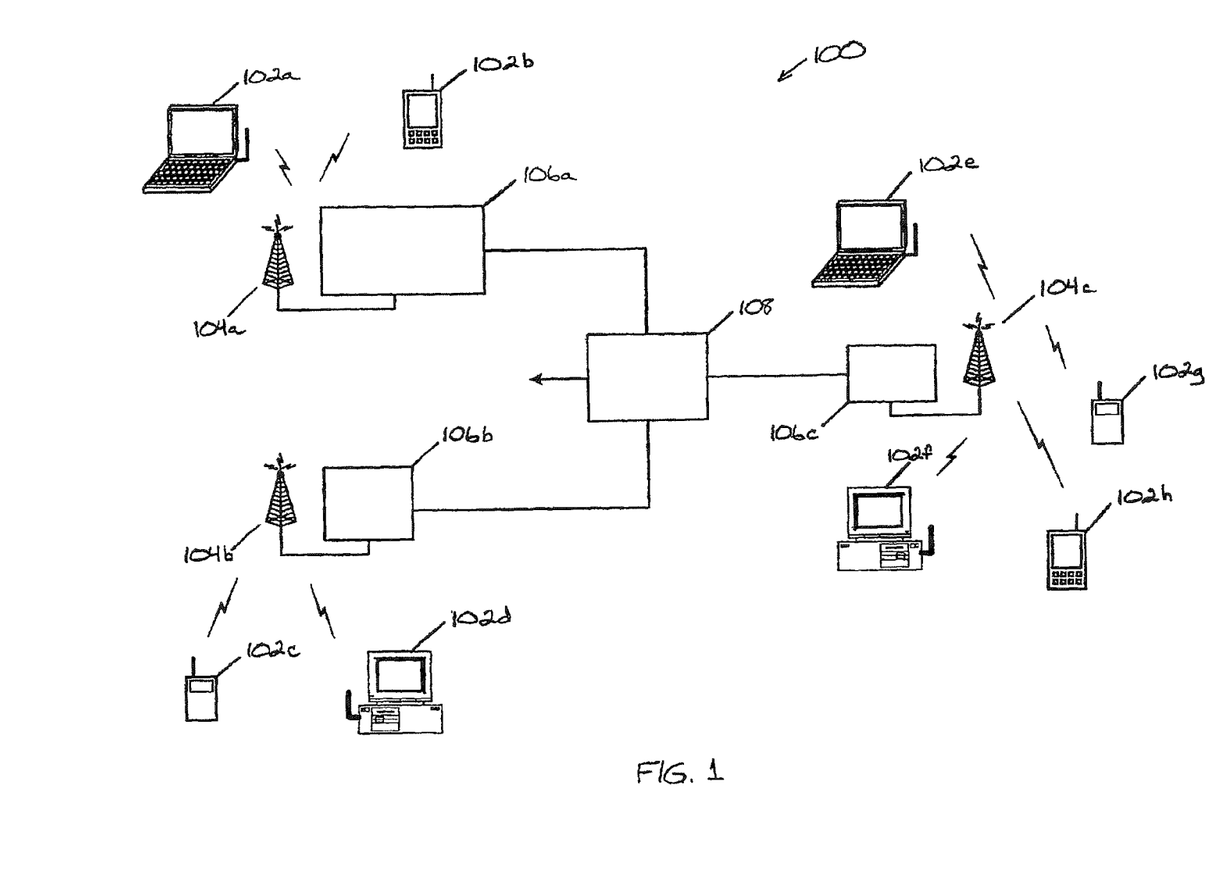
FIG. 1 is a block diagram of an example communication system, according to an embodiment of the present invention.

This specification discloses one or more embodiments that incorporate the features of this invention. The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Furthermore, when a particular feature, structure, or characteristic is described in connection with an embodiment, it is submitted that it is within the knowledge of one skilled in the art to effect such feature, structure, or characteristic in connection with other embodiments whether or not explicitly described. ps I. Example System Implementation FIG. 1 is a block diagram of an example communication system 100, according to an embodiment of the present invention. Communication system 100 includes communication devices 102a-h, forwarding elements 106a-c, and network hardware 108. Example communication devices 102a-h include, but are not limited to, a cellular telephone, a two-way radio, a personal digital assistant (PDA), a personal computer (PC), a laptop computer, home entertainment equipment, etc.

In FIG. 1, communication devices 102a and 102e are shown to be laptop computers. Communication devices 102b and 102h are shown to be personal digital assistants. Communication devices 102c and 102g are shown to be cellular telephones. Communication devices 102d and 102f are shown to be personal computers. The example communication devices 102 shown in FIG. 1 are provided for illustrative purposes and are not intended to limit the scope of the present invention. In an aspect, at least one of communication devices 102a-h is a wireless device. In another aspect, at least one of communication devices 102a-h is hard-wired to other element(s) (e.g., a forwarding element 106) in wireless communication system 100. Communication system 100 may include any number of communication devices 102.

Forwarding elements 106a-c forward information received from respective communication devices 102a-h to network hardware 108, and/or vice versa. Example forwarding elements 106 include, but are not limited to, a base station (e.g., for a cellular service), a wireless access point (e.g., for an in-home or in-building wireless network), etc. In a first aspect, forwarding elements 106a-c process information received from respective communication devices 102a-h and provide the processed information to network hardware 108.

In FIG. 1, forwarding elements 106a-c receive information from respective communication devices 102a-h via corresponding antennas 104a-c. In a second aspect, forwarding elements 106a-c process information received from network hardware 108 and provide the processed information to respective communication devices 102a-h. In FIG. 1, forwarding elements 106a-c provide the processed information to respective communication devices 102a-h via corresponding antennas 104a-c. Network hardware 108 can be any type of network hardware, including but not limited to a router, a switch, a bridge, a modem, or a system controller.

Communication devices 102a-h communicate directly and/or indirectly with each other. For direct communications (also known as point-to-point communications), receivers and transmitters of participating communication devices are tuned to the same channel or channels. For example, a channel may be one of a plurality of radio frequency (RF) carriers utilized by wireless communication system 100. The participating communication devices communicate via the channel (s) to which they are tuned.

For indirect communications, communication devices 102 communicate with each other via one or more forwarding elements 106. Each communication device 102 communicates directly with an associated forwarding element 106 via an assigned channel, and associated forwarding elements 106 communicate with each other directly via a system controller, the public switch telephone network, the Internet, and/or another network. A communication device 102 may register with a particular forwarding element 106 to receive services from communication system 100, though the scope of the invention is not limited in this respect.

Communication system 100 can operate in accordance with any of a variety of communication standards, including but not limited to IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

II. Example Communication Device

Figure 2:
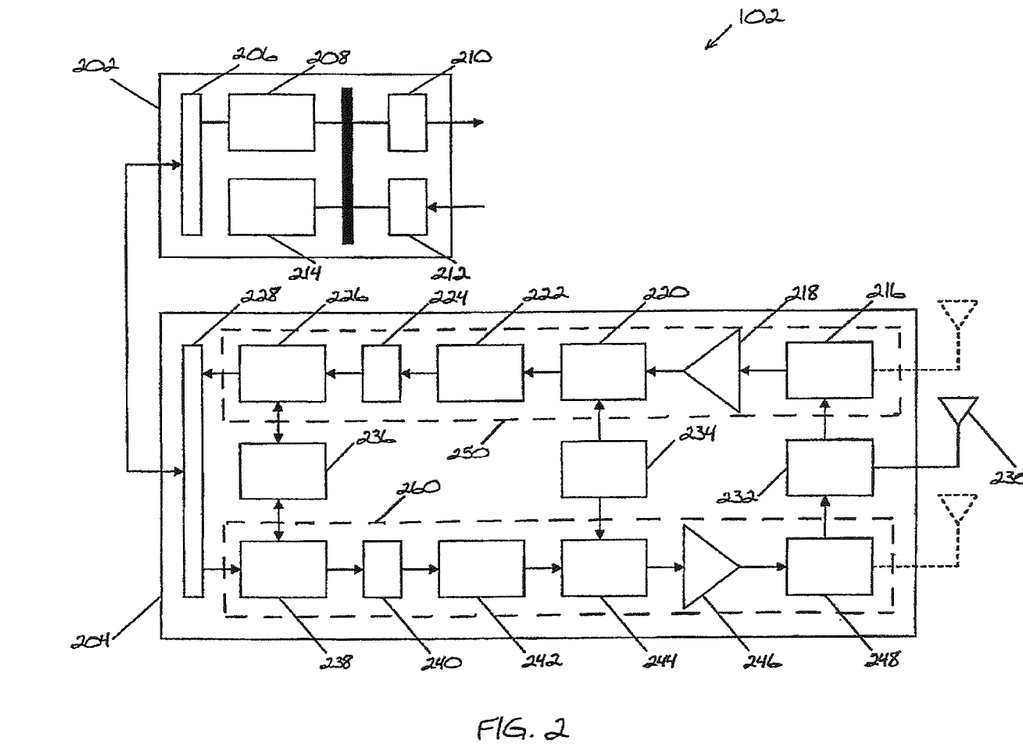
FIG. 2 is a block diagram of an example communication device, according to an embodiment of the present invention.

FIG. 2 is a block diagram of an example communication device 102, according to an embodiment of the present invention. In FIG. 2, communication device 102 includes a host device 202 and an associated radio 204. Radio 204 need not necessarily be included in communication device. In embodiments, radio 204 is externally coupled to communication device 102. For cellular telephones, radio 204 is a built-in component. For personal digital assistants, laptops, and/or personal computers, radio 204 may be built-in or an externally coupled component.

Referring to FIG. 2, host 202 includes a radio interface 206, a processing module 208, an output interface 210, an input interface 212, and a memory 214. Input interface 212 receives information (e.g., instructions or data) from any of a variety of devices, including but not limited to a keyboard, a keypad, a microphone, etc. Processing module 208 processes the information. For example, a processing module of a cellular telephone host performs operations in accordance with a cellular telephone standard. Processing module stores and/or retrieves data associated with the information, or the information itself, in memory.

Radio interface 206 allows information to be received from and sent to radio 204. Radio interface 206 provides information that is received from radio 204 to processing module 208 for processing and/or routing to output interface 210. Output interface 210 provides connectivity to an output display device (e.g., a display, a monitor, speakers, etc.) to display the information. Radio interface 206 provides information from processing module 208 to radio 204. In an aspect, processing module 208 receives information from input interface 212 or generates the information itself. Processing module 208 performs a host function to process the information and/or routes the information to radio 204 via radio interface 202.

Radio 204 includes a receive path 250, a transmit path 260, an antenna 230, a transmit/receive switch 232, a local oscillation module 234, a memory 236, and a host interface 228. Receive path 250 may be configured to perform operations including, but not limited to, digital intermediate frequency (IF) to baseband conversion, demodulation, constellation demapping, decoding, or descrambling. Transmit path 260 may be configured to perform operations including, but not limited to, scrambling, encoding, constellation mapping, modulation, or digital baseband to IF conversion.

In the embodiment of FIG. 2, receive path 250 includes a receiver filter 216, a low noise amplifier (LNA) 218, a down-conversion module 220, a filter/attenuation module 222, an analog-to-digital converter (ADC) 224, and a digital receiver processing module 226. Antenna 230 receives an in-bound radio frequency (RF) signal from a forwarding element 106. Transmit/receive switch 232 switches to a receive mode to transfer the in-bound RF signal to receiver filter 216. Receiver filter 216 band-pass filters the in-bound RF signal, and LNA 218 amplifies the filtered in-bound RF signal to provide an amplified in-bound RF signal. Down-conversion module 220 combines the amplified in-bound RF signal and a local oscillator signal to provide a down-converted signal (e.g., an intermediate frequency (IF) signal or a baseband signal). Local oscillation module 234 provides the local oscillator signal to down-conversion module 220. Filter/attenuation module 222 filters the down-converted signal and/or attenuates unwanted out-of-band signals to provide a filtered down-converted signal, which ADC 224 converts from an analog format to a digital format. Digital receiver processing module 226 processes the digital signal received from ADC 224 to recapture the in-bound RF signal received at antenna 230 in accordance with a standard associated with radio 204. Digital receiver processing module 226 can process the digital signal received from ADC 224 in any of a variety of ways, including but not limited to decoding, descrambling, de-mapping, and/or demodulating the signal received from ADC 224. Host interface provides the recaptured in-bound RF signal to host 202 via radio interface 206.

As shown in FIG. 2, transmit path 260 includes a digital transmitter processing module 238, a digital-to-analog converter (DAC) 240, a filter/gain module 242, an up-conversion module 244, a power amplifier (PA) 246, and a transmit filter 248. Host interface 228 receives an out-bound digital signal from host 202 and routes the out-bound digital signal to digital transmitter processing module 238. Digital transmitter processing module 238 processes the out-bound digital signal in accordance with a standard, such as Institute of Electrical and Electronics Engineers (IEEE) 802.11a, IEEE 802.11b, Bluetooth, etc. to provide a formatted signal (e.g., a digital baseband signal or a digital IF signal). In an aspect, digital transmitter processing module 238 provides a digital IF signal in a frequency range from approximately one-hundred kilohertz to a few megahertz. DAC 240 converts the formatted signal from a digital format to an analog format. Filter/gain module 242 filters and/or adjusts the gain of the analog signal received from DAC 240 to provide a filtered signal. Up-conversion module 244 combines the filtered signal and a local oscillator signal to provide an up-converted signal (e.g., an RF signal). Local oscillation module 234 provides the local oscillator signal to up-conversion module 244. Power amplifier 246 amplifies the up-converted signal, which is filtered by transmit filter 248 to provide an out-bound RF signal. Transmit/receive switch 232 switches to a transmit mode to transfer the out-bound RF signal to antenna 230. Antenna 230 transmits the out-bound RF signal to a targeted communication device.

In the embodiment of FIG. 2, antenna 230 is a single antenna that is shared by receive path 250 and transmit path 260, as controlled by transmit/receive switch 232. In an alternative embodiment, antenna 230 includes separate antennas for receive path 250 and transmit path 260. The antenna implementation depends on the standard with which communication device 102 is associated.

Persons of ordinary skill in the relevant art(s) will recognize that communication device 102 may be implemented using integrated circuit(s). In an aspect, host 202 is implemented on a first integrated circuit, and radio 204 is implemented on second and third integrated circuits. In this aspect, digital receiver processing module 226, digital transmitter processing module 238, and memory 236 are implemented on the second integrated circuit, and the remaining components of radio 204, except antenna 230, are implemented on the third integrated circuit. In another aspect, radio 204 is implemented on a single integrated circuit. In yet another aspect, digital receiver processing module 226 and digital transmitter processing module 238 of radio 204 and processing module 208 of host 202 constitute a processing device implemented on a common integrated circuit. In still another aspect, memories 214 and 236 are implemented on a common integrated circuit. For instance, memories 214 and 236 may be implemented on the same integrated circuit as processing module 208, digital receiver processing module 226, and digital transmitter processing module 238.

Digital receiver processing module 226 and digital transmitter processing module 238 may be implemented using a shared processing device, individual processing devices, or a plurality of processing devices. Example processing devices include, but are not limited to, a microprocessor, a microcontroller, a digital signal processor (DSP), a microcomputer, a central processing unit (CPU), a field programmable gate array, a programmable logic device, a state machine, logic circuitry, analog circuitry, digital circuitry, and/or any device that manipulates signals (e.g., analog and/or digital signals) based on operational instructions. Memory 214 or 236 may be a single memory device or a plurality of memory devices. Memory 214 or 236 may be a read-only memory (ROM), a random access memory (RAM), a volatile memory, a non-volatile memory, a static memory, a dynamic memory, a flash memory, and/or any device that stores digital information.

According to embodiments of the present invention, local oscillator module 234 includes a fractional-N synthesizer. A fractional-N synthesizer has a phase locked loop (PLL) topology that allows for fractional adjustments of a feedback signal via a multi-modulus divider. The fractional adjustments allow fine tuning of a local oscillator signal provided by local oscillator module 234. In an aspect, the fractional-N synthesizer facilitates tuning communication device 102 to an intermediate frequency (IF) or a channel.

III. Example Fractional-N Synthesizer

Figure 3:
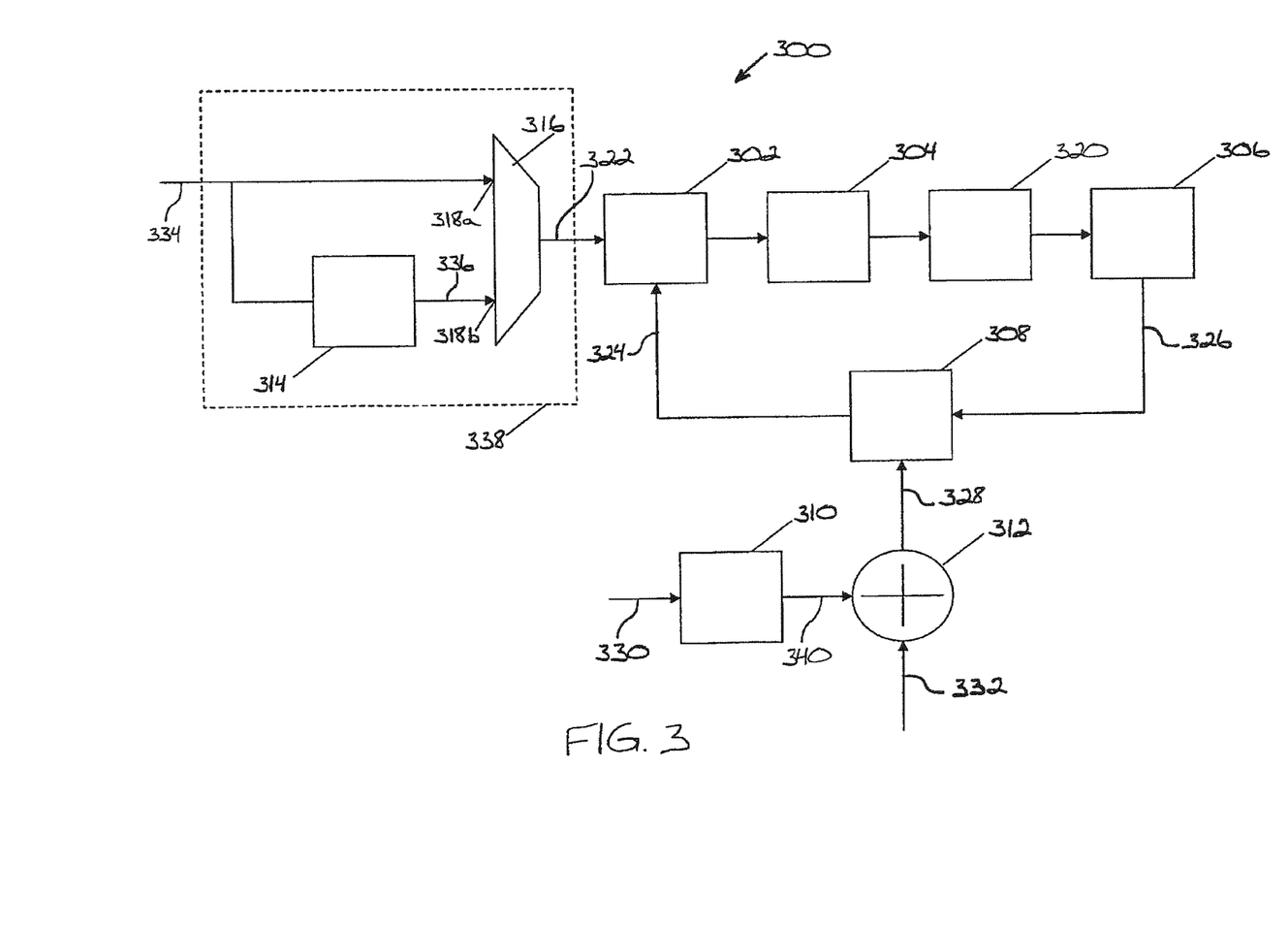
FIGS. 3-5 are block diagrams of an example fractional-N synthesizer, according to embodiments of the present invention.

FIG. 3 is a block diagram of an example fractional-N synthesizer 300, according to an embodiment of the present invention. Fractional-N synthesizer 300 includes a phase frequency detector 302, a charge pump 304, a voltage controlled oscillator (VCO) 306, a multi-modulus divider (MMD) 308, a modulator 310, an adder 312, a loop filter 320, and a frequency change module 338. In FIG. 3, frequency change module 338 provides a reference signal 322 based on an input signal 334. Phase frequency detector 302 provides a phase error signal based on reference signal 322 and a feedback signal 324. For example, reference signal 322 has a reference frequency and a reference phase. Feedback signal 324 has a feedback frequency and a feedback phase. Phase frequency detector 302 compares the reference phase and the feedback phase to determine a phase difference. The phase error signal is proportional to the phase difference. In an aspect, phase frequency detector 302 compares the reference frequency and the feedback frequency to determine a frequency difference. In this aspect, phase frequency detector 302 generates the phase error signal based on the phase difference and the frequency difference.

Charge pump 304 provides a charge based on the phase error signal. The charge provided by charge pump 304 and the phase difference represented by phase error signal are substantially proportional. The charge provided by charge pump 304 is accumulated and filtered by loop filter 320 to generate a control voltage for voltage controlled oscillator 306. Voltage controlled oscillator 306 provides an output signal 326 having a frequency that is based on the control voltage provided by loop filter 320. A relatively higher voltage provided by loop filter 320 corresponds with a relatively higher frequency for output signal 326. Relatively lower voltage corresponds with a relatively lower frequency for output signal 326.

In the embodiment of FIG. 3, multi-modulus divider 308 divides the frequency of output signal 326 by a value 328 received from adder 312 to provide feedback signal 324 having the feedback frequency. The feedback frequency is directly proportional to the frequency of output signal 326 and inversely proportional to value 328. In another embodiment, the feedback frequency is directly proportional to both value 328 and the frequency of output signal 326. In this embodiment, multi-modulus divider 308 multiplies the frequency of output signal 326 by value 328 to provide feedback signal 324 having the feedback frequency.

Modulator 310 (e.g., a sigma-delta modulator) processes a fractional value 330 to provide a randomized integer sequence that includes a plurality of integer values to adder 312. In an aspect, the randomized integer sequence is a pseudo-random integer sequence having an average value that is substantially equal to fractional value 330. Adder 312 combines an integer value 340 of the randomized integer sequence and an integer value 332 to provide value 328 to multi-modulus divider 312. In FIG. 3, adder 312 adds integer value 340 and integer value 332 to generate value 328 at the output of adder 312. The average value of adder output 328 represents a ratio of the frequency of output signal 326 to the frequency of reference signal 322. The average value of adder output 328 has an integer component N and a fractional component F. The average value of adder output 328 may be represented as N.F. Integer component N may be any integer value, including zero. Fractional component F may be any fractional value, including zero.

Fractional component F allows the frequency of output signal 326 to be a non-integer multiple of the frequency of reference signal 322. However, fractional component F causes voltage controlled oscillator 306 to provide a spur that is associated with output signal 326. The frequency $f_{spur}$ of the spur is represented by the following equation:

$$f_{spur} = f_{out} \pm F * f_{ref} \text{ for } F \leq 0.5$$

$$f_{spur} = f_{out} \pm (1-F) * f_{ref} \text{ for } F > 0.5, \quad \text{(Equation 1)}$$

where $f_{out}$ is the frequency of output signal 326 and $f_{ref}$ is the frequency of reference signal 322.

Frequency change module 338 is capable of changing the frequency $f_{ref}$ of reference signal 322, thereby changing the frequency $f_{spur}$ of the spur. In an aspect, frequency change module 338 increases a difference between the frequency $f_{out}$ of output signal 326 and the frequency $f_{spur}$ of the spur. For example, frequency change module 338 may change the frequency $f_{spur}$ of the spur to be outside a passband of fractional-N synthesizer 300.

In FIG. 3, frequency change module 338 includes a spur reduction module 314 and a switching module 316. An input signal 334 is received at a first input terminal 318a of switching module 316. Spur reduction module 314 processes input signal 334 and provides a processed input signal 336 at a second input terminal 318b of switching module 316. Switching module 316 selectively provides input signal 334 or processed input signal 336 to phase frequency detector 302 as reference signal 322. Switching module 316 assigns input signal 334 or processed input signal 336 to be reference signal 322.

In an aspect, switching module 316 is a multiplexer. In another aspect, switching module 316 is a switch. Persons skilled in the relevant art(s) will recognize that switching module 316 may be any element that is capable of selecting between input signal 334 and processed input signal 336.

Having input signal 334 at a first frequency and processed input signal 336 at a second frequency that is different from the first frequency allows switching module 316 to change the frequency of reference signal 322. Changing the frequency of reference signal 322 increases the difference between the frequency of output signal 326 and the frequency of a spur associated with output signal 326. For instance, the low pass response of fractional-N synthesizer 300 may filter out the spur. In an aspect, switching module 316 changes the frequency of reference signal 322 from the first frequency to the second frequency by switching from input signal 334 to processed input signal 336. In another aspect, switching module 316 changes the frequency of reference signal 322 from the second frequency to the first frequency by switching from processed input signal 336 to input signal 334.

Figure 4:
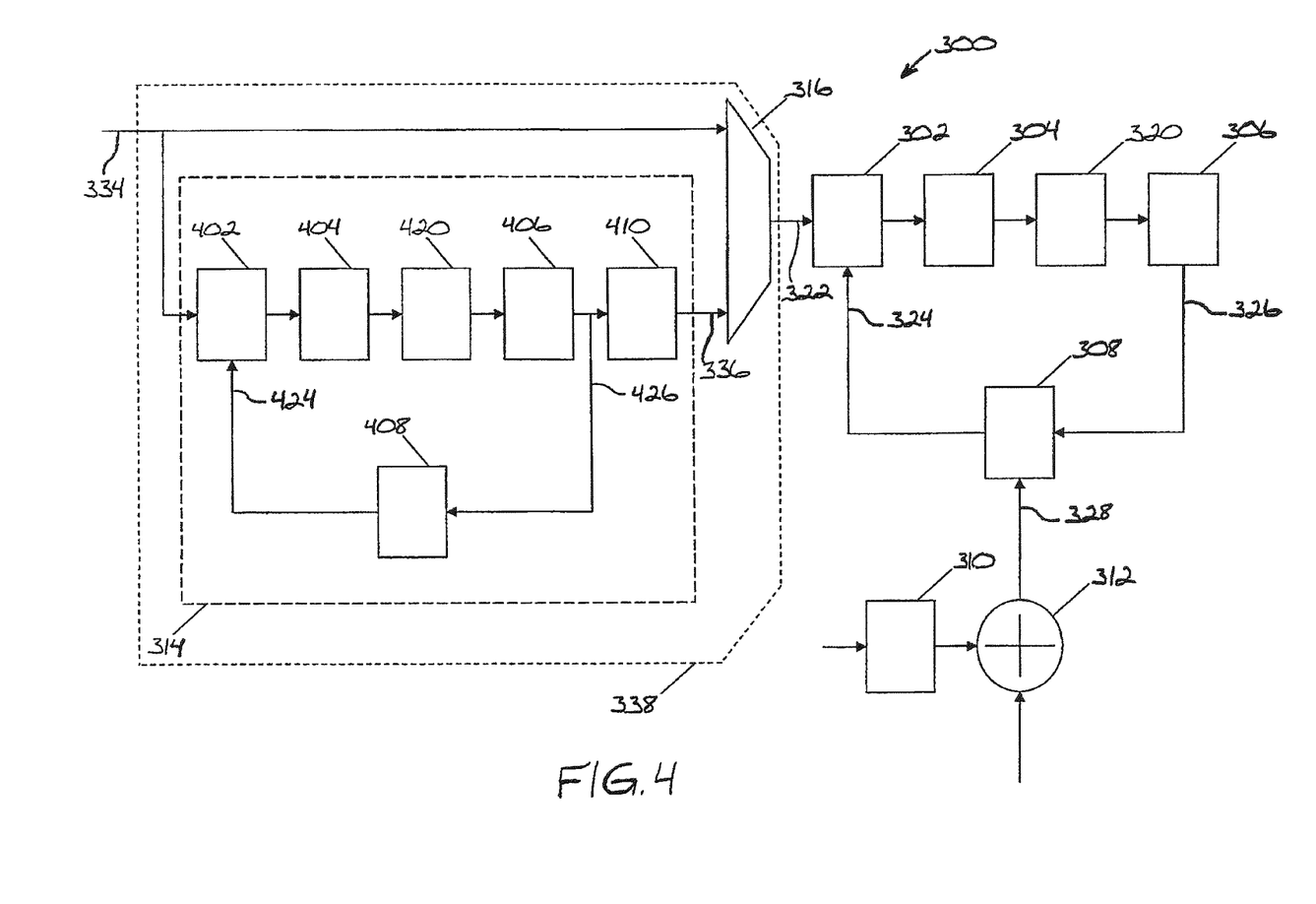

FIG. 4 is a block diagram of example fractional-N synthesizer 300, according to another embodiment of the present invention. In FIG. 4, spur reduction module 314 includes a second phase frequency detector 402, a second charge pump 404, a second voltage controlled oscillator 406, a first divider 408, a second divider 410, and a second loop filter 420. Second phase frequency detector 402 provides a second phase difference based on first input signal 334 and a second feedback signal 424. Second charge pump 404 provides an output charge based on the second phase difference. The output charge is accumulated and filtered by second loop filter 420 to generate a second control voltage for second voltage controlled oscillator 406. Second voltage controlled oscillator 406 provides an oscillator output signal 426 based on the second control voltage received from second loop filter 420. First divider module 408 divides the frequency of oscillator output 424 by a first value J to provide second feedback signal 424. Second divider 410 divides the frequency of oscillator output signal 426 by a second value K to provide second input signal 336.

The frequency $f_1$ of first input signal 334 and the frequency $f_2$ of second input signal 336 are related according to the following equation:

$$f_2 = f_1 * \left(\frac{J}{K}\right) \quad \text{(Equation 2)}$$

Referring to Equation 2, the frequency $f_2$ of second input signal 336 is directly proportional to the frequency $f_1$ of first input signal 334 and to the first value J, and the frequency $f_2$ of second input signal 336 is inversely proportional to the second value K. The frequency $f_2$ of second input signal 336 may be changed by changing the first value J and/or the second value K.

In FIG. 4, if switching module 316 selects input signal 334 to be reference signal 322, then the frequency $f_{spur}$ of the spur is represented as:

$$f_{spur} = f_{out} \pm F * f_1 \text{ for } F \leq 0.5$$

$$f_{spur} = f_{out} \pm (1-F) * f_1 \text{ for } F > 0.5, \quad \text{(Equation 3)}$$

where $f_{out}$ is the frequency of output signal 326 and $f_1$ is the frequency of input signal 334. On the other hand, if switching module 316 selects processed input signal 336 to be reference signal 322, then the frequency $f_{spur}$ of the spur is represented as:

$$f_{spur} = f_{out} \pm F' * f_2 \text{ for } F \leq 0.5$$

$$f_{spur} = f_{out} \pm (1-F') * f_2 \text{ for } F > 0.5, \quad \text{(Equation 4)}$$

where F' is the fractional component of the average value of adder output 328 when switching module 316 selects processed input signal 336 to be reference signal 322. The average value of adder output 328 has an integer component N' and a fractional component F' when input signal 336 is selected to be reference signal 322. The average value of adder output 328 may be represented as N'.F', where $$N' \cdot F' = (N \cdot F)\left(\frac{J}{K}\right).$$

Referring to Equation 4, when switching module 316 selects processed input signal 336 to be reference signal 322, the frequency $f_{spur}$ of the spur can be changed by changing the first value J and/or the second value K.

Recall that value 328 represents the ratio of the frequency $f_{out}$ of output signal 326 to the frequency $f_{ref}$ of reference signal 322. Changing the frequency $f_{ref}$ of reference signal 322 by a factor changes value 328 by the inverse of the factor. For example, changing the frequency $f_{ref}$ of reference signal from $f_1$ to $$f_2 = f_1 * \left(\frac{J}{K}\right)$$

changes value 328 from N.F to $$N \cdot F * \left(\frac{K}{J}\right).$$

If changing value 328 changes the fractional component F of value 328, then the frequency $f_{spur}$ of the spur changes accordingly.

A reference feed-through associated with spur reduction module 314 may be folded down and provided as a spur by charge pump 304. In an aspect, the ratio of the first value J to the second value K is selected to be in a range between 1.23 and 1.50. Selecting the ratio in this range can cause the spur to be at an offset high enough to be filtered by a low pass response of fractional-N synthesizer 300. In another aspect, the first value J is selected such that the frequency $f_{out}$ of oscillator output signal 426 remains in a range that is as small as possible. This may reduce the power consumption of second voltage controlled oscillator 426, for example.

According to a first embodiment, frequency change module 338 changes the frequency of reference signal 322 based on the fractional component F. For example, frequency change module 338 may change the frequency of reference signal 322 in response to fractional component F being equal to, less than, greater than, or proximate to a predetermined fractional value. In another example, frequency change module 338 may change the frequency of reference signal 322 in response to fractional component F being within a predetermine range of fractional values.

When fractional component F is approximately zero or one, voltage controlled oscillator 306 provides a spur having a frequency $f_{spur}$ that is relatively near the frequency $f_{out}$ of output signal 326. The low pass response of fractional-N synthesizer 300 may fail to filter out the spur, thereby passing the spur along with output signal 326. In an aspect, frequency change module 338 changes the frequency $f_{ref}$ of reference signal 322 to change the fractional component F, thereby changing the frequency $f_{spur}$ of the spur. In this aspect, the frequency $f_{ref}$ of the reference signal 322 is changed to move the fractional component F away from zero or one. In another aspect, the frequency $f_{ref}$ of the reference signal 322 is changed to move the fractional component F away from zero, one, or one-half For instance, a fractional component F of approximately one-half may cause a spur having a frequency $f_{spur}$ that is passed by the low pass response of fractional-N synthesizer 300.

In an aspect, frequency change module 338 increases a difference between the frequency $f_{out}$ of output signal 326 and the frequency $f_{spur}$ of the spur. For example, frequency change module 338 may increase or decrease the frequency $f_{spur}$ of the spur to be outside a passband of fractional-N synthesizer 300.

According to a second embodiment, frequency change module 338 changes the frequency $f_{ref}$ of reference signal 322 based on a low pass response of fractional-N synthesizer 300. In an aspect, frequency change module 338 changes the frequency $f_{ref}$ of reference signal 322 based on a relationship between a predetermined attenuation requirement of fractional-N synthesizer 300 and the low pass response of fractional-N synthesizer 300. The attenuation requirement may be set in accordance with a standard, such as an Institute of Electrical and Electronics Engineers (IEEE) standard, a Bluetooth standard, a multiple input multiple output (MIMO) standard, or any other wireless standard. In another aspect, changing the frequency $f_{ref}$ of reference signal 322 causes a spur associated with output signal 326 to be filtered by the low pass response of fractional-N synthesizer 300.

Figure 6:
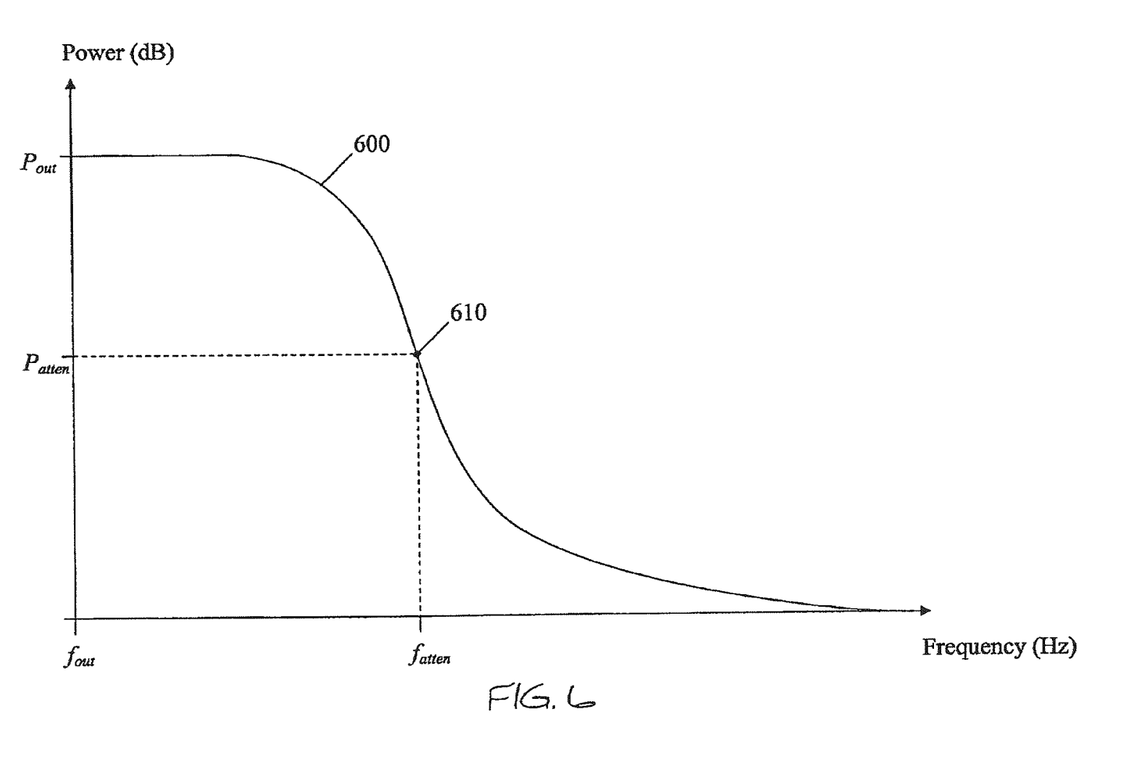
FIG. 6 illustrates an example low pass response of a fractional-N synthesizer, according to an embodiment of the present invention.

FIG. 6 illustrates an example low pass response 600 of fractional-N synthesizer 300, according to an embodiment of the present invention. In FIG. 6, low pass response 600 is shown with reference to the frequency $f_{out}$ of output signal 326. As illustrated in FIG. 6, output signal 326 has a frequency $f_{out}$ and a power $P_{out}$. A predetermined attenuation requirement establishes a power $P_{atten}$ below which a signal may not be properly detected at an output of fractional-N synthesizer 300. In FIG. 6, the power $P_{atten}$ corresponds with point 610 along low pass response 600 of fractional-N synthesizer 300. As illustrated in FIG. 6, frequencies greater than an attenuation frequency $f_{atten}$ at the output of fractional-N synthesizer 300 are attenuated below the power $P_{atten}$ established by the predetermined attenuation requirement. Accordingly, spurs at frequencies greater than the attenuation frequency $f_{atten}$ are filtered by low pass response 600 of fractional-N synthesizer 300.

In an aspect, frequency change module 338 changes the frequency $f_{ref}$ of reference signal 322 in response to the frequency $f_{spur}$ of the spur being less than or equal to the attenuation frequency $f_{atten}$. For example, changing the frequency $f_{ref}$ of reference signal 322 may increase the frequency $f_{spur}$ of the spur to be greater than the attenuation frequency $f_{atten}$. In this example, the spur is attenuated by low pass response 600 of fractional-N synthesizer 300, and not passed along with output signal 326 by voltage controlled oscillator 306.

In another aspect, switching module 316 is controlled to switch between a first state and a second state. In the first state, switching module 316 provides input signal 334 to phase frequency detector, such that reference signal 322 is input signal 334. In the second state, switching module 316 provides processed input signal 336 to phase frequency detector, such that reference signal 322 is processed input signal 336. If switching module 316 is configured in the first state and detects that the frequency $f_{spur}$ of the spur is less than or equal to the attenuation frequency $f_{atten}$, then switching module 316 switches from the first state to the second state. If switching module 316 is configured in the second state and detects that the frequency $f_{spur}$ of the spur is less than or equal to the attenuation frequency $f_{atten}$, then switching module 316 switches from the second state to the first state.

Figure 5:
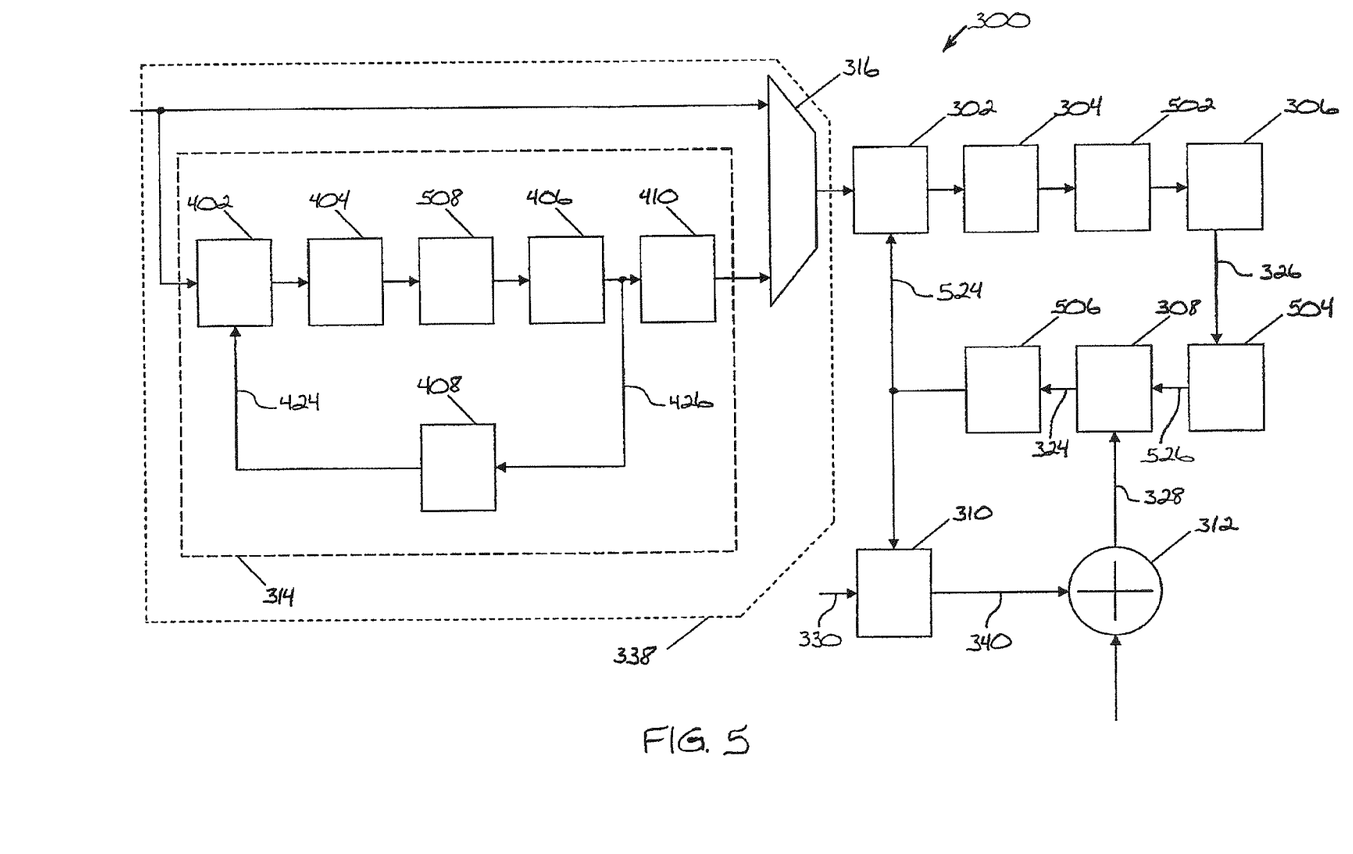

Non-linearities in the components of fractional-N synthesizer 300 can increase the magnitude of spurs associated with output signal 326 of fractional-N synthesizer 300. In FIG. 5, fractional-N synthesizer 300 includes a first low pass filter (LPF) 502, a pre-scaler 504, a re-timing block 506, and a second LPF 508, any of which may be used to linearize the performance of fractional-N synthesizer 300. First low pass filter 502 is coupled between charge pump 304 and voltage controlled oscillator 306 to mitigate high-frequency noise associated with the charge provided by charge pump 304.

Pre-scaler 504 is coupled between voltage controlled oscillator 306 and multi-modulus divider 308 to generate a signal 526 based on output signal 326 and having a frequency less than that of output signal 326. Pre-scaler 504 divides the frequency of output signal 326 by an integer value or a non-integer value to provide signal 526 to multi-modulus divider 308. Providing a lower-frequency signal to multi-modulus divider 308 reduces the power needed to operate multi-modulus divider 308, but corresponds with a higher noise floor.

Re-timing block 506 is coupled between multi-modulus divider 308 and phase frequency detector 302 to reduce jitter associated with feedback signal 324. In FIG. 5, re-timing block 506 provides a reduced jitter feedback signal 524 to phase frequency detector 302 and to modulator 310. In an aspect, the modulated fractional value provided to adder 312 by modulator 310 is based on reduced jitter feedback signal 524.

In an aspect, jitter associated with feedback signal 324 is based on modulation of fractional value 330 that is performed by modulator 310. For example, modulation of fractional value 330 may cause a supply voltage or current of multi-modulus divider 308 to vary, thereby changing the shape of the noise floor associated with feedback signal 324.

Second low pass filter 508 is coupled between second charge pump 404 and second voltage controlled oscillator 406 to mitigate high-frequency noise associated with the output charge provided by charge pump 404.

IV. Example Method

Figure 7:
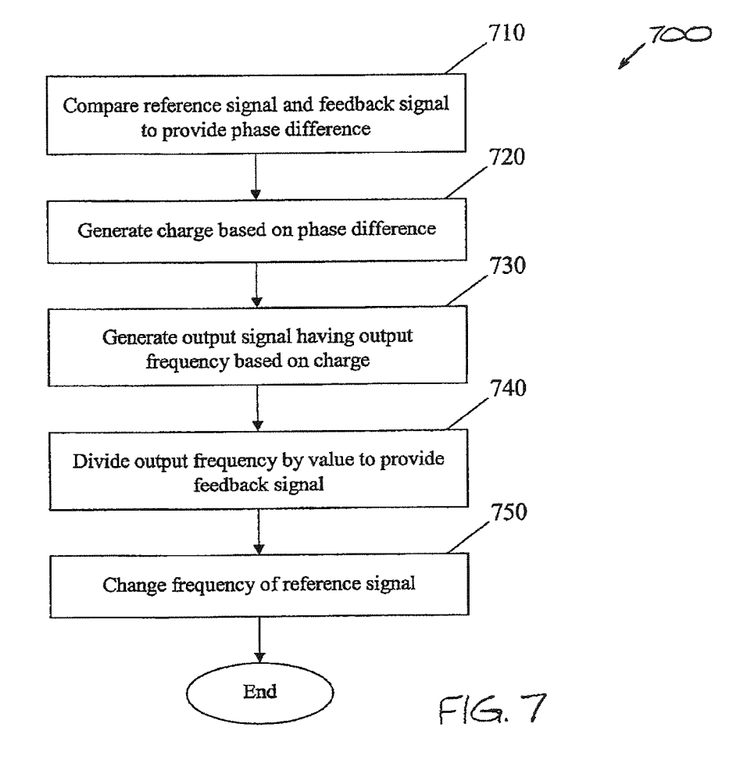
FIG. 7 illustrates a flowchart of a method of reducing a spur in accordance with an embodiment of the present invention.

FIG. 7 illustrates a flowchart 700 of a method of reducing a spur in accordance with an embodiment of the present invention. The invention, however, is not limited to the description provided by the flowchart 700. Rather, it will be apparent to persons skilled in the relevant art(s) from the teachings provided herein that other functional flows are within the scope and spirit of the present invention.

Flowchart 700 will be described with continued reference to example fractional-N synthesizer 300 described above in reference to FIGS. 3-5, though the method is not limited to those embodiments.

Referring now to FIG. 7, phase frequency detector 302 compares a reference signal and a feedback signal to provide a phase difference at block 710. Charge pump 304 generates a charge based on the phase difference at block 720. Voltage controlled oscillator 306 generates an output signal having an output frequency that is based on the charge at block 730. Multi-modulus divider 308 divides the output frequency by a value to provide the feedback signal having a feedback frequency at block 740. Frequency change module 338 changes a frequency of the reference signal at block 750. According to a first embodiment, frequency change module 338 changes the frequency of the reference signal based on a low pass response 600 of fractional-N synthesizer 300. In a second embodiment, frequency change module 338 changes the frequency of the reference signal based on a fractional component of the value utilized by multi-modulus divider 308.

In an aspect, frequency change module 338 changes the frequency of the reference signal in response to the frequency of a spur being less than or equal to a predetermined frequency. In another aspect, the difference between the output frequency and the frequency of the spur increases in response to changing the frequency of the reference signal. In yet another aspect, the fractional component is de-spurred in response to changing the frequency of the reference signal. In still another aspect, the fractional component is moved away from zero, one, or one-half in response to changing the frequency of the reference signal.

V. Conclusion

Example embodiments of the methods, systems, and components of the present invention have been described herein. As noted elsewhere, these example embodiments have been described for illustrative purposes only, and are not limiting. Other embodiments are possible and are covered by the invention. Such other embodiments will be apparent to persons skilled in the relevant art(s) based on the teachings contained herein. Thus, the breadth and scope of the present invention should not be limited by any of the above described exemplary embodiments, but should be defined only in accordance with the following claims and their equivalents.

What is claimed is:

1. A synthesizer, comprising:
   a phase locked loop (PLL) configured to provide a synthesizer output signal based on a phase difference between a reference signal and a feedback signal; and
   a frequency change module configured to change a frequency of the reference signal to move a frequency of a spur associated with the synthesizer output signal;
   wherein the frequency change module includes a switching module configured to receive a first input signal having a first frequency and a second input signal having a second frequency that is different from the first frequency,
   wherein the switching module is configured to select the first input signal or the second input signal to be the reference signal based on a low pass response of the PLL.

2. The synthesizer of claim 1, wherein the PLL is further configured to provide a fractional adjustment of the feedback signal.

3. The synthesizer of claim 2, wherein the fractional adjustment provided by the PLL is changed by a factor inversely proportional to the change in frequency of the reference signal provided by the frequency change module.

4. The synthesizer of claim 1, wherein the frequency change module further includes:
   a spur reduction module that is configured to process the first input signal to generate the second input signal.

5. The synthesizer of claim 4, wherein the spur reduction module includes:
   a phase frequency detector configured to provide a second phase difference based on the first input signal and a second feedback signal;
   a charge pump configured to provide an output charge based on the second phase difference;
   a loop filter configured to provide a control voltage based on the output charge;
   a voltage controlled oscillator configured to provide an oscillator output signal based on the control voltage;
   a first divider module configured to divide a frequency of the oscillator output signal by a first value to provide the second feedback signal; and
   a second divider module configured to divide the frequency of the oscillator output signal by a second value to provide the second input signal.

6. The synthesizer of claim 5, wherein the first frequency $f_1$ of the first input signal is related to the second frequency $f_2$ of the second input signal according to the equation $$f_2 = f_1 * \left(\frac{J}{K}\right);$$

wherein J represents the first value; and
wherein K represents the second value.

7. The synthesizer of claim 1, wherein the frequency change module is configured to increase a difference between a frequency of the synthesizer output signal and the frequency of the spur.

8. The synthesizer of claim 7, wherein the frequency change module is configured to change the frequency of the spur to be outside a passband of the PLL.

9. A receiver for down-converting a radio frequency (RF) input signal, comprising:
   a local oscillator configured to provide a local oscillator signal, comprising:
   a phase locked loop (PLL) configured to provide the local oscillator signal based on a phase difference between a reference signal and a feedback signal; and
   a frequency change module configured to change a frequency of the reference signal to move a frequency of a spur associated with the local oscillator signal,
   wherein the frequency change module includes a switching module configured to receive a first input signal having a first frequency and a second input signal having a second frequency that is different from the first frequency, wherein the switching module is configured to select the first input signal or the second input signal to be the reference signal based on a low pass response of the PLL, and a down-conversion module configured to combine the local oscillator signal and the RF input signal to provide a down-converted signal.

10. The receiver of claim 9, wherein the PLL is further configured to provide a fractional adjustment of the feedback signal.

11. The receiver of claim 10, wherein the fractional adjustment provided by the PLL is changed by a factor inversely proportional to the change in frequency of the reference signal provided by the frequency change module.

12. The receiver of claim 9, wherein the frequency change module is configured to increase a difference between a frequency of the local oscillator signal and the frequency of the spur.

13. The receiver of claim 12, wherein the frequency change module is configured to change the frequency of the spur to be outside a passband of the PLL.

14. A transmitter for up-converting an input signal, comprising:
a local oscillator configured to provide a local oscillator signal, comprising:
a phase locked loop (PLL) configured to provide the local oscillator signal based on a phase difference between a reference signal and a feedback signal; and
a frequency change module configured to change a frequency of the reference signal to move a frequency of a spur associated with the local oscillator signal,
wherein the frequency change module includes a switching module configured to receive a first input signal having a first frequency and a second input signal having a second frequency that is different from the first frequency,
wherein the switching module is configured to select the first input signal or the second input signal to be the reference signal based on a low pass response of the PLL, and
an up-conversion module configured to combine the local oscillator signal and the input signal to provide an up-converted signal.

15. The transmitter of claim 14, wherein the PLL is further configured to provide a fractional adjustment of the feedback signal.

16. The transmitter of claim 15, wherein the fractional adjustment provided by the PLL is changed by a factor inversely proportional to the change in frequency of the reference signal provided by the frequency change module.

17. The transmitter of claim 14, wherein the frequency change module is configured to increase a difference between a frequency of the local oscillator signal and the frequency of the spur.

18. The transmitter of claim 15, wherein the frequency change module is configured to change the frequency of the spur to be outside a passband of the PLL.

19. The transmitter of claim 14, wherein the transmitter is part of a cellular telephone.

20. The receiver of claim 9, wherein the receiver is part of a cellular telephone.

* * * * *